United States Patent [19]

Romeas et al.

[11] Patent Number: 4,672,596

[45] Date of Patent: Jun. 9, 1987

[54] LEVEL CONTROLLED READOUT SYSTEM FOR FORMATTED RECORD RECORDED ON AN OPTICAL DISC

[75] Inventors: René Romeas, Palaiseau; Daniel Lecomte, Paris, both of France

[73] Assignee: Thomson-CSF, Paris, France

[21] Appl. No.: 624,592

[22] Filed: Jun. 26, 1984

[30] Foreign Application Priority Data

Jul. 4, 1983 [FR] France ............................ 83 11072

[51] Int. Cl.⁴ ......................... H04N 5/76; G11B 5/09
[52] U.S. Cl. ....................................... 369/59; 369/48
[58] Field of Search ............... 369/47, 48, 59; 360/40, 360/41

[56] References Cited

U.S. PATENT DOCUMENTS 4,566,092  1/1986  Gerard et al. ..................... 369/49

Primary Examiner—Vincent P. Canney
Attorney, Agent, or Firm—Roland Plottel

[57] ABSTRACT

The invention relates to the reshaping of a read signal in such a manner as to compensate for possible distortions, in particular of its cyclic ratio. During a time interval selected by a control device as as function of synchronizing data present on the disc, the synchronizing information is integrated by means of an integrator. The voltage threshold obtained is compared with the data read by means of a comparator circuit. The result of the comparison gives rise to a signal of rectangular form. This signal may usefully serve the purpose of adjusting the phase of the read system. The device may be utilized in particular in a device for rephasing the clock emitting the read pulses.

9 Claims, 16 Drawing Figures

LEVEL CONTROLLED READOUT SYSTEM FOR FORMATTED RECORD RECORDED ON AN OPTICAL DISC

BACKGROUND OF THE INVENTION

The present invention relates to a method of reshaping a signal produced by reading data recorded on an optical disc. It is applicable in particular for reshaping synchronising pulses derived from data prerecorded on the disc and serving the purpose of rephasing the clock giving the clock cycles The invention equally relates to a device employing this method.

The recording methods are well known to those versed in the art and lie beyond the scope of the present invention. These data are most frequently recorded in the form of microreliefs along tracks having the form of a spiral or of concentric circles. To facilitate random access to a recorded data item a recording is partitioned into blocks or sectors.

At the time of recording user information, the different binary elements are recorded along a track at evenly spaced positions within each data block alloted to this user information. Synchronising means should consequently be provided to subsequently enable the retrieval of the rank assigned to each element recorded. To perform a reading operation it is necessary to generate timing signals for the purpose of retrieving the position of each binary element in the recorded sequence.

According to a first approach, in the so-called multitrack systems, each track alloted for recording user information is associated with at least one timing track along which are recorded clock signals permitting a synchronized reading of the user information. In a given embodiment, the synchronisation tracks are precut and comprise optically detectable and evenly spaced markings. During the reading operation with a multibeam readout device, a first optical beam is focussed on the user information track for reading the recorded data, and a second optical beam which is separate from the first but in a condition of constant mechanical coupling with the first, is utilised to read the synchronising data stored in the timing track. With a single beam readout device both the user information track and the timing track are scanned with the same optical beam. In this case, discrimination should be performed between the two kinds of data. By way of example, the frequency spectra respectively allocated to user and timing data should be different. In this later case precut synchronising data may be utilised while writing in the user information.

In order to increase the recording density, the use a single track has been suggested. In this case, the synchronising clock signals may be derived from reading the user data itself.

In order to simplify synchronisation, writing in the user data is conventionally done with codes described as being self-synchronising or as having a maximum of transitions, since such codes provide synchronization whatever the content of the user data stream. To store data coded in this fashion, the recording is made of microreliefs which have two reference levels, respectively allocated to transcribe the logic values "0" and "1". The synchronising signals are derived from the detection of the transitions occuring between these levels, and these transitions are utilised as timing signals for the frequency and phase synchronization of a turntable oscillator, conventionally of the kind utilising voltage control (known by the abbreviation VCO. This oscillator is electrically controlled with a PLL device receiving these transitions and the voltage supplied by the oscillator (PLL: "phase locked loop"). Futhermore, special bursts of recorded pulses are utilised to initiate clocking.

However, this kind of coding does not permit maximum recording density. It is also known, for increasing this density, to make use of codes which are not self-synchronising, for example the NRZ code (non-return to zero). This kind of code has the characteristic that it lacks a transition from one information bit to the next one when these two bits have the same logic value. The timing signals needed for synchronisation are then more difficult to derive by reading the information coded in this manner. Synchronising means operating with such codes are however known, for example, from the U.S. Pat. No. 4,566,092 which describes a method and device in which the synchronisation elements or "flags" are prerecorded at uniformly spaced intervals along the tracks of the disc. Each time a flag runs past beneath a pickup head, the circuits operating with synchronising signals resynchronise the write-read system and in particular a clock circuit providing the write-read cycles. To this end, it is appropriate to have available synchronising signals having substantially constant duration and cyclic ratio, which may be compared to those of the clock signals.

As is apparent from the foregoing, these synchronising signals originate from specific data elements prerecorded on the disc. by reason of data arrangement on the disc, two corresponding data elements respectively located on a peripheral track and on a central track of the disc, are of different length. Furthermore, the recording of these data elements occurs either by optical means or by pressing, and may give rise to distortion. Similarly, the reading of these data elements is affected by deformations caused by imperfections of the reading systems, by mamufacturing tolerances, and by other factors such as the efficiency and quality of the optical devices, the sensitivity of the cells and the power of the light source.

SUMMARY OF THE INVENTION

The invention consequently has as its object a system for restoring a switching waveform from a read out signal produced by optically reading data recorded on an optical disc comprising synchronising data incorporating a sequence of alternate binary elements of a first and a second logic level. A portion of the readout signal corresponding to the scanning of the alternate sequence of binary elements is selectively transmitted for signal processing. The duration of sampling of this portion encompasses first and second summed durations respectively corresponding to said first logic level and to said second logic level, said summed durations having equal amounts. The processing consists in updating by integration a mean voltage value corresponding to the selectively transmitted portion for setting the reference threshold of a comparator circuit performing the restoring of the readout signal by issuing a switching waveform which may be clipped.

BRIEF DESCRIPTION OF THE DRAWINGS

A better understanding of the invention will be obtained and other features and advantages will appear from the following description given with reference to the accompanying drawings, in which.

DESCRIPTION OF THE PREFERRED EMBODIMENTS

The methods for storing data on an optical disc are well known. The disc normally comprises at least one radiation sensitive layer, commonly a surface layer, of a material sensitive to certain kinds of radiation. According to one of the best-known methods, an optical beam generated by a laser source is focussed on this radiation sensitive layer during the writing in of data, and microreliefs are formed along the tracks by thermo-optical action. These tracks may be virtual, that is to say produced at the instant of entering the data, or else may be pre-cut in any optional form. The methods of reading data and of following tracks are equally well known. An optical beam, which may be a read beam or a beam utilised for the write operation, is commonly utilised for following the track, or else one and the same optical beam is utilised for all the operations. The interaction between this optical beam and the microreliefs travelling under a read head creates diffraction effects which are detected by opto-electronic detection means. The read operation may take place either by transmission through the disc and detection by means of photodetector cells placed close to the underside of the disc, or by reflection of the radiation from the disc and reverse return of the light picked up by optical systems comprising mirrors beaming the reflected beams towards photo-detector cells.

Figure 1:
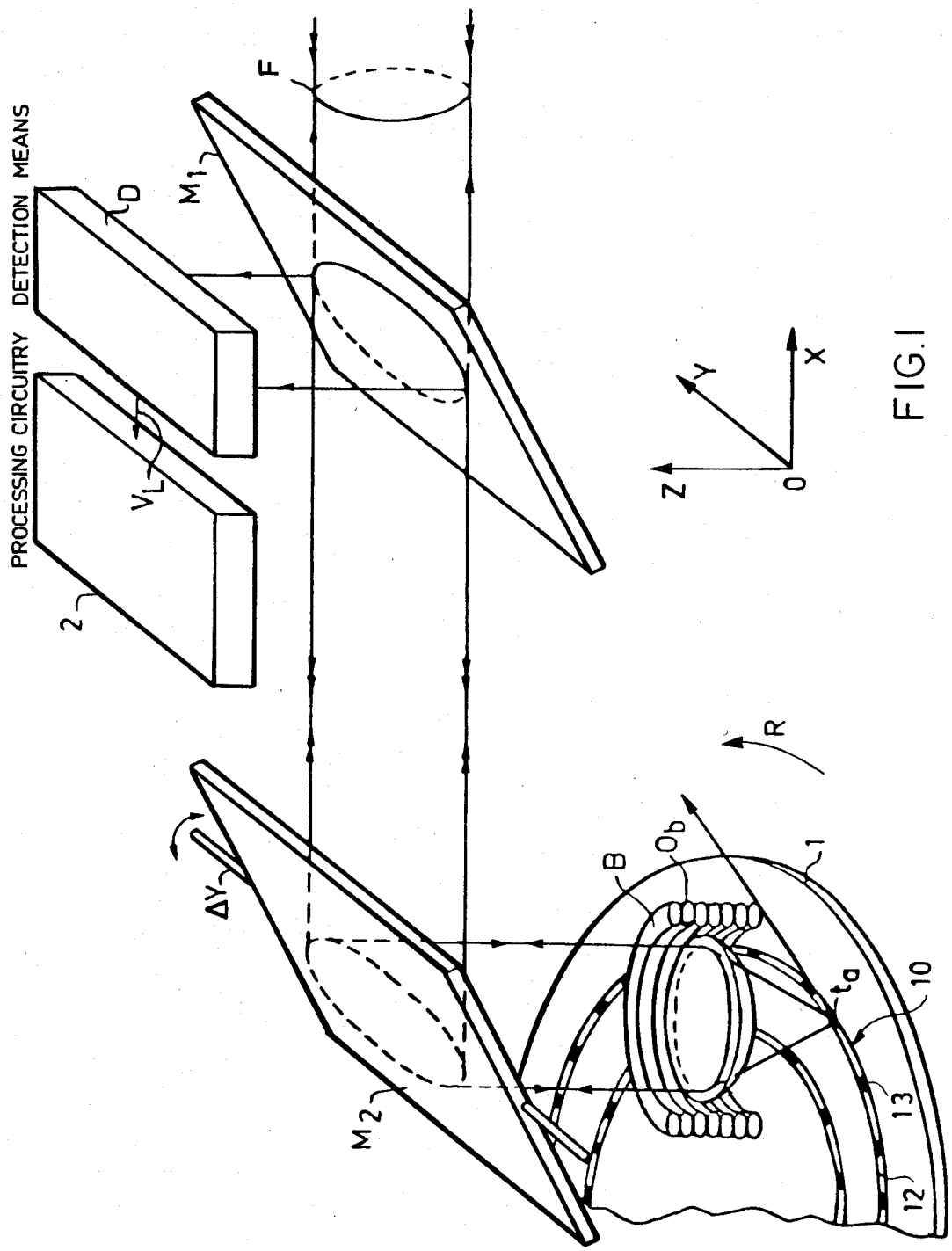
FIG. 1 diagrammatically illustrates a record-reading apparatus wherein the device of the invention may be employed.

FIG. 1 illustrates in diagrammatical manner a device in which an optical beam F, supplied by means which are not illustrated, passes through a first mirror M1, is reflected by a second mirror M2 towards a focussing lens Ob which focusses the beam at a point ta situated on a track 10 of a disc 1. Depending on the nature of the information present at the point ta, the beam is reflected, then retransmitted by the lens Ob, the mirrors M2 and M1, towards a detection device D. The latter is equipped with photo-electric cells which convert the luminous intensity of the beam into an electrical signal VL. The signal VL is transmitted to a processing circuit 2 which supplies a readout signal LEC shown at (b) in FIG. 3 with various shapes.

The system of FIG. 1 is provided with adjusting means such as an electromagnetic coil B for axial displacement of the lens Ob or with means (not illustrated) whereby the mirror M2 may be tilted around its axis ΔY.

The disc 1 is spinning about a rotation axis in the direction of the arrow R so that data elements of the disc running past the focal point of the lens Ob.

Figure 2:
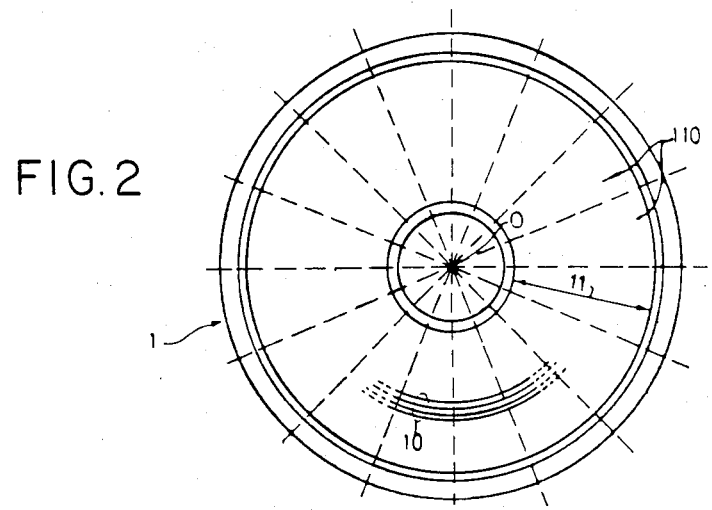
FIG. 2 illustrates a shematic arrangement of an optical disc utilised in the device of the invention, FIG. 3 consisting of A through D illustrates the method of the invention by means of waveforms.

As illustrated in FIG. 2, the tracks 10 occupy an annular area 11. By way of example, this area may have a width of 8 cms in a disc of a diameter of 30 cms, and 40,000 tracks adjacent one another may be arranged between the inner and outer boundaries of this area.

The whole of the disc 1 is divided into angular sectors such as the sectors 110. 16 sectors are shown in the example of FIG. 2. Each track element 10 corresponding to one convolution is thus divided into 16 recording sections. The different track sections belonging to one and the same sector contain or are liable to contain (if still blank) an identical number of data elements. A recording section of a peripheral track element of the disc contains the same number of data elements as a recording section of a track element closer to the centre O of the disc. The lengths alloted to the data elements are consequently smaller for the inner track elements than for the outer elements track.

The data recorded or to be recorded on the sections of each track element 10 are organised in blocks of 64 binary elements such as the block 12 in FIG. 1. Some blocks are beginning with a characteristic header 13 identifiable from the data as a flag. These flags make it possible to order the data write and read sequences on the disc. Accordingly they make it possible to perform a synchronisation of the write-read circuits as a function of the running speed of the disc in relation with the objective lens Ob projecting the reading light spot. In practice, especially in the case of NRZ codes as described previously, a clock circuit is provided as a time base for controlling the write and read cycles during which the binary elements are stored on the record carrier or sampled from the readout signal. The clocking pulses supplied by the clock are controlled in frequency and phase for synchronism with the scanning of the headers of the disc by the reading light spot.

The flags recorded on the disc prior to any recording of user data supply the reference for frequency synchronisation and rephasing of the clock controlling the storage and retrieval of each block 12 of binary elements.

A flag is a sequence of markings made on the disc to represent a string arrangement of "0" and "1" having specific durations in the readout signal.

The detection of a flag of this nature is performed by means of circuits well known in the art. Circuits for frequency synchronisation of the clock by reference to one or more constituents of the flag are also well known.

Rephasing of the clock, is under the control of an electric signal in the form of a switching waveform derived from the readout signal via a threshold circuit. Due to distorsions occuring during prerecording or during the read operation, the readout signal may be altered in its shape, and this results in incorrect rephasing of the clock. This is specially the case when, if the cyclic ratio of the readout signal, i.e. the ratio between the duration in the low state and the duration in the high state is straying from nominal value.

Figure 3:
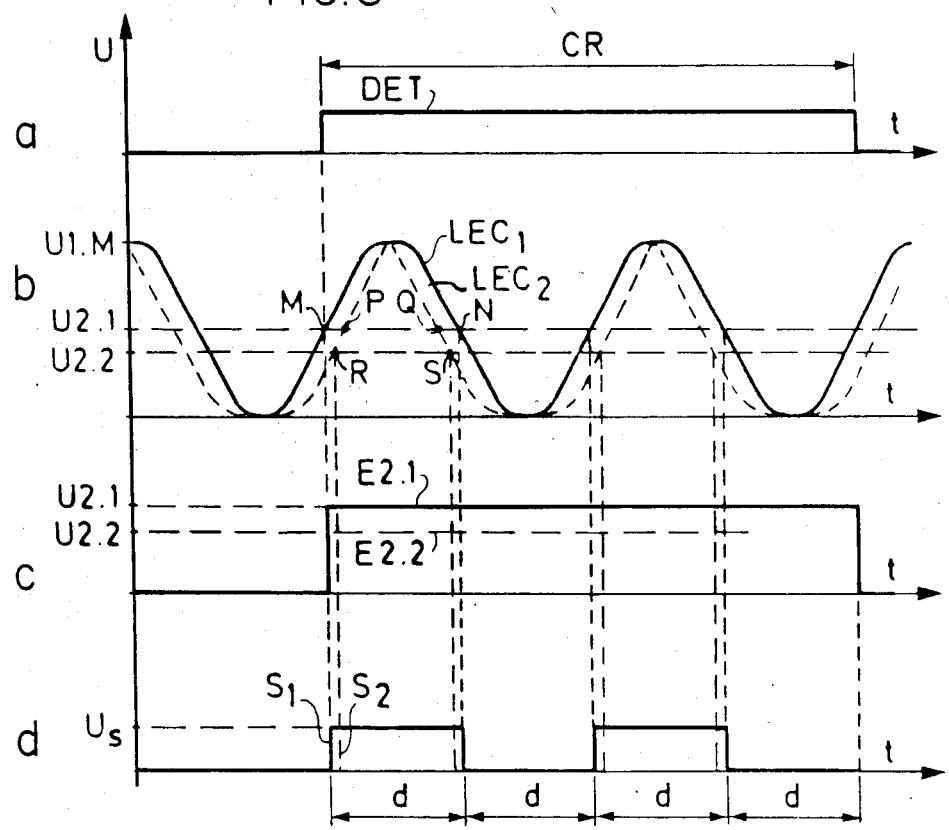

This is why the invention provides a method, illustrated in FIG. 3, which compensates for variations of cyclic ratio while reshaping a readout signal.

In order to simplify matters, there is considered a flag formed of a string of markings representing an alternate sequence of logic "1" and "0", these binary elements having the same duration in the normal readout signal for which the cyclic ratio is unity.

This flag gives rise, after reading by the device shown in FIG. 1 to a nominal read signal LEC1 of the form illustrated by the waveform LEC 1 at (b) in FIG. 3. This signal is considered as being distortion free so that its cyclic ratio is equal to unity. The signal LEC1 has sloping rising and trailing flanks. This is attributable to the optical read mode of the data on the disc and to the optical transmission system in the read head. This lack of steepness in the waveform of the read signal is a drawback, but the invention takes advantage of this defect for property reshaping the readout signal.

According to the invention, a period CR is determined, such that the sum of the periods during which the read signal LEC1 is at a particular logic level "0" for example, is equal to the sum of the periods during which this same signal is at another logic level "1", for example. On the waveform (a) of FIG. 3, a signal DET having a duration CR equal to the equivalent of two binary elements "0" and of two binary elements "1" has been selected by way of example.

During this period CR, the signal LEC1 is integrated and produces a voltage signal E2.1 illustrated by the waveform (c) in of FIG. 3, the voltage level U2.1 of which represents a mean voltage level of the signal LEC1. Signal LEC1 and its mean voltage are subtracted from each other a comparator circuit; the positive part of the difference is amplified and then clipped to a voltage level Us, in such a manner as to produce a rectangular waveform. By plotting the voltage level U2.1 on the diagram (b), switching points such as M and N delimiting the duration of the rectangular waveform to be determined, are obtained on the signal LEC1. The resulting waveform S1 has been illustrated on the diagram (d) in FIG. 3. As stated in the foregoing, the signal LEC1 being of nominal shape, a symmetry is obtained for the signal with respect to the level U2.1. The waveform S1 arising from comparing signal LEC 1 to its mean voltage level has the nominal shape, with pulses of an amplitude Us and of duration d, and intervals of duration d between pulses. Its cyclic ratio is therefore 1.

A readout signal whose shape deports from the signal LEC1 but shown in phase therewith, will now be considered. For example, this is a signal LEC2 as shown by the dashed waveform (b) in FIG. 3. This dashed waveform exhibits a cyclic ratio which differs from unity when measured along the mean level of the signal LEC1.

Firstly, it is apparent from FIG. 3 that if the same voltage threshold U2.1 were retained for reshaping the signal LEC2 as the one fed to the comparator for reshaping the signal LEC1, the switching points P and Q would be displaced in relation with points M and N.

Thanks to the process of the invention, the signal LEC2 is integrated yielding a mean voltage level U2.2 shown at the diagram (c) in FIG. 3. This new mean level, plotted on the diagram (b), intersects the waveform LEC2 at two points R and S which are substantially less displaced than points P and Q. The slopes of the rising and trailing flanks of the signals LEC1 and LEC2 are substantially equal, and are such by virtue of the read system. Therefore the points R and S have projections on the axis of the abscissaae t quite close to the projections of points M and N. Signal LEC2 and its mean voltage value E2.2 are subtracted from each other in the comparator circuit. The positive part is amplified and clipped. A rectangular waveform S1 is thus obtained, shown dashed on the diagram (d) in FIG. 3, which differs little from waveform S1. The waveform S2 consequently has a cyclic ratio differing little from that of waveform S1. The method of the invention, consequently makes it possible, whilst shaping a read signal, to automatically compensate for a distortion of the read signal, such as a cyclic ratio vibration, and to obtain substantially the same reshaped rectangular waveform at the output of the comparator circuit.

Figure 4:
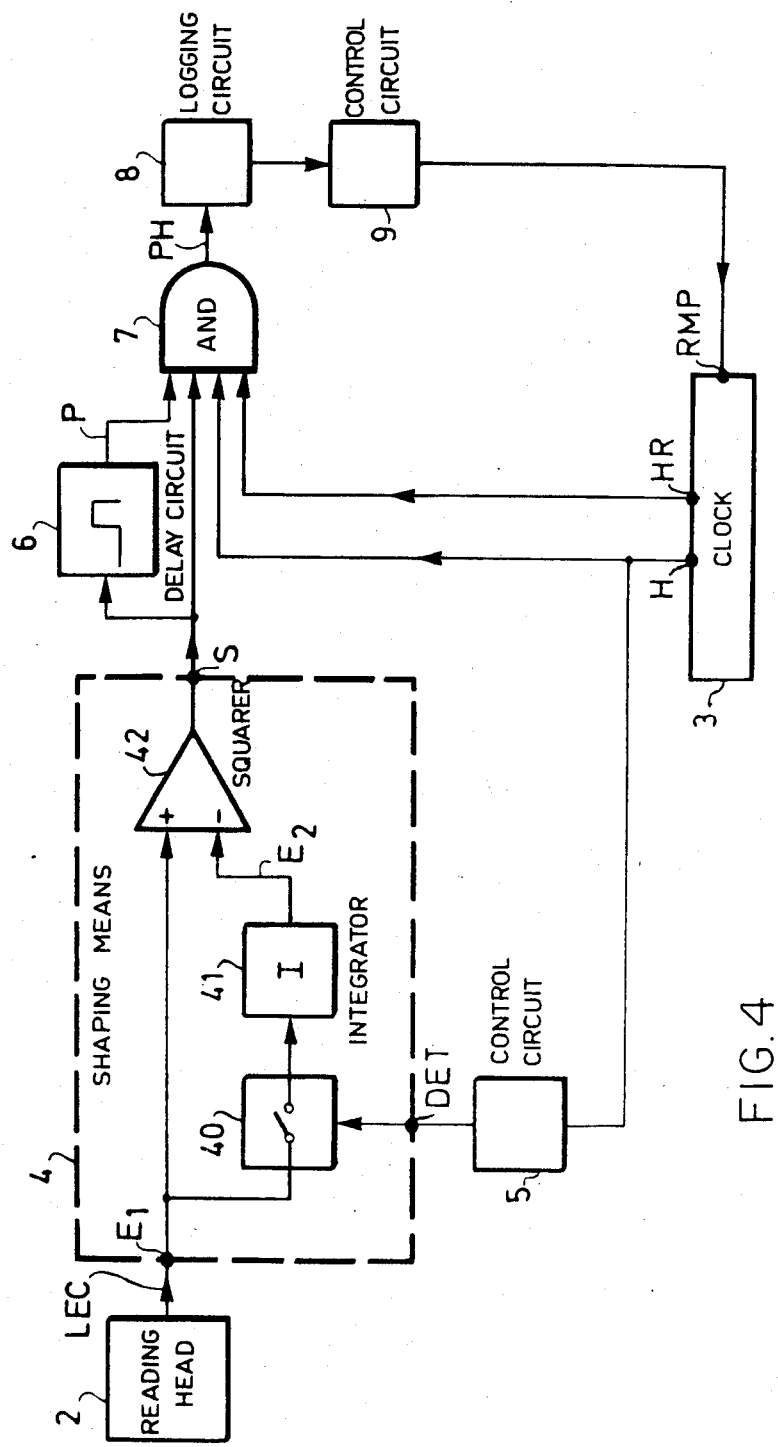
FIG. 4 illustrates one embodiment of the device according to the invention, FIG. 5 consisting of A through H illustrates the operation of the device according to the invention, by means of waveforms.

The method of the invention may be applied using the circuit device shown in FIG. 4. FIG. 4 shows the processing circuit 2 of FIG. 1, supplying at its output a read signal LEC whose various shapes are illustrated at the diagram (b) in FIG. 3.

The output LEC of circuit 2 is connected to an input E1 of a shaper device 4. This device 4 comprises a switch 40 operating under the control of the signals received at the input DET, an integrator circuit 41 integrating the signals supplied by the switch 40, a comparator circuit 42 comprising two inputs and an output S providing a rectangular waveform having a level determined in accordance with the levels of the signals applied to the two inputs of this comparator circuit which performs a squaring function.

The circuit arrangement of FIG. 4 moreover comprises: a clock 3 supplying signals H and HR to be phase adjusted; a control circuit 5 of the switch 40; a time-delay circuit 6 connected to the output S, a gate 7 of the AND type of which the inputs are connected to the output S, to the time-delay circuit 6 and to the clock 3; a phase difference evaluating circuit 8 coupled to the output of the AND gate 7 and a phase control circuit 9 connected to the output of circuit 8.

At its LEC output, the read device 2 supplies a signal LEC1, for example, of the kind illustrated on the diagram (b) in FIG. 3, which represents with a wavy shape the reading of the disc 1.

Figure 5:
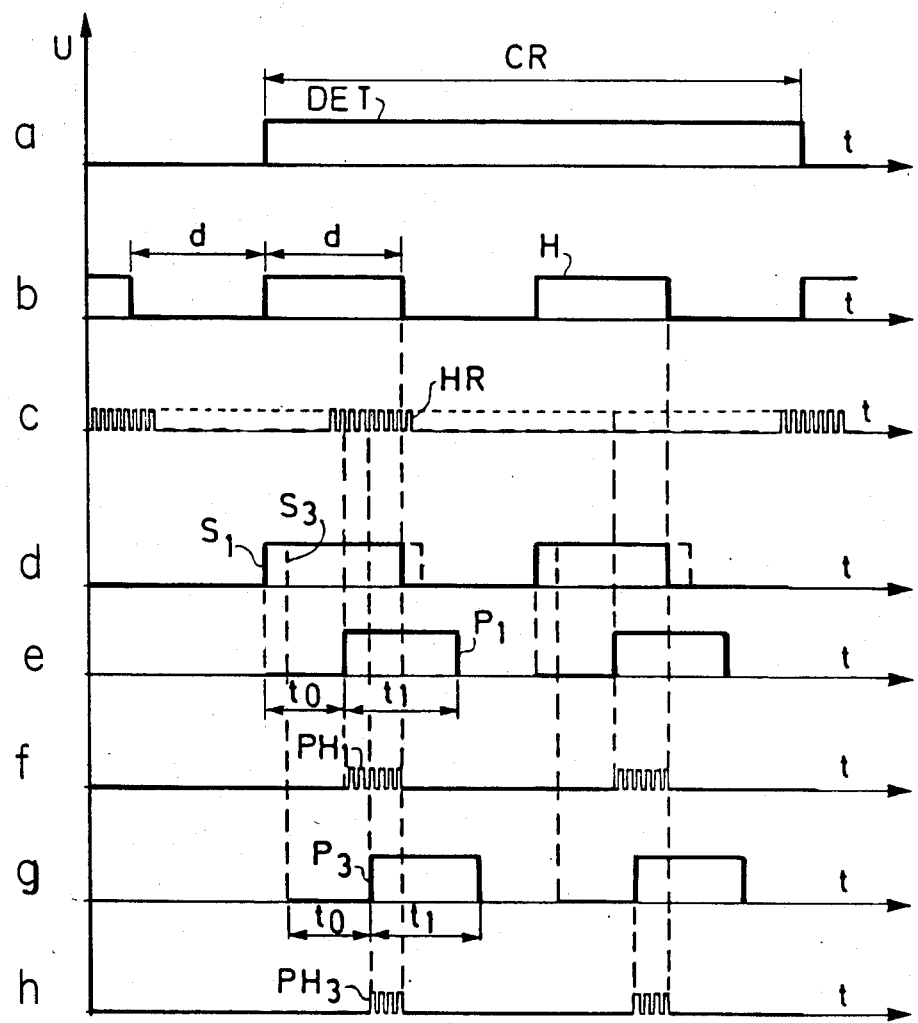

The clock 3 permanently supplies pulsed signals at its outputs H and HR, such as respectively illustrated by the diagrams (b) and (c) in FIG. 5. By way of information example, the frequency of the signal HR is 16 times greater than the frequency of the signal H. The duration of a pulse, as well as the interval between pulses in signal H, have a valued corresponding to the duration of logic states "0" or "1" of a read signal.

Means which are not illustrated and lie outside the ambit of the invention permit detecting the maxima of the signal LEC1 and performing an approximate phase adjustment of the clock signal H to the signal LEC1. The device of the invention will thus enable performing this phase adjustment more precisely.

The signal H is transmitted to a control circuit 5. The latter counts the number of pulses in signal H, in such a manner as to establish the time at which the flags on the disc 1 are scanned by the reading light spot. A that time, the control circuit 5 supplies a control signal DET to the input DET of the shaping device 4. This signal DET illustrated by the diagram (a) in FIG. 5 has a duration CR equal to four times the duration d. The signal DET controls the closing of the switch 40. During the duration CR, the input of the integrator circuit 41 is connected to input E1. The portion of signal LEC1 selected by the closure of switch 40 is integrated by the integrator 41. The latter provides a signal E2.1 illustrated by the diagram (c) in FIG. 3, to the inverting input of the comparator circuit 42. The non inverting input of the comparator circuit 42 receives the signal LEC1. The comparator circuit 42 supplies a rectangular waveform S1, illustrated by the diagram (d) in FIG. 3 and by the diagram (d) in FIG. 5.

The waveform S1 is transmitted to the time-delay circuit 6. With a time delay t0 from the leading edge of a positive pulse in the waveform S1, the time-delay circuit 6 delivers at its output P a pulse P1 having a duration t1. The AND gate 7 establish coincidence between the signals received at its four inputs, namely: the waveform S1, the pulse P1, the clock signals H and HR. For a duration within which all the signals S1, P1 and H are at a logic level 1, the gate 7 allows the clock pulses HR to pass. The pulsed signal PH1 supplied, and illustrated by the diagram (f) in FIG. 5, is formed by pulses the number of which is characteristic of the phase shift between waveform S1 derived from the read signal LEC1, and the clock signal H. The pulses PH1 are transmitted to a counter 8 and the count fed to a phase control circuit 9. Since the waveform is in phase with the clock signal H, the circuit 9 keeps the phase of the clock unaffected.

However, should a signal S3 such as shown in dashed lines on the diagram (d) in FIG. 3 be obtained at the output S in the circuit 4 of FIG. 4, then the read signal and the clock signal H will be out of phase. The leading flank of the signal S3 triggers the circuit 6 which after a time delay t0 supplies a signal P3 of a duration t1 as illustrated by the diagram (g) in FIG. 5.

Establishing coincidence in the gate 7 of the signals H, HR, P3 and S3 leads now to a signal PH3 illustrated by the diagram (h) in FIG. 5. The number of pulses forming PH3 differs from the number of pulses of the signal PH1. Accordingly, the phase control circuit 9 interprets the difference and issues an appropriate command to the input RMP of the clock for phase resynchronization purpose.

Figure 6:
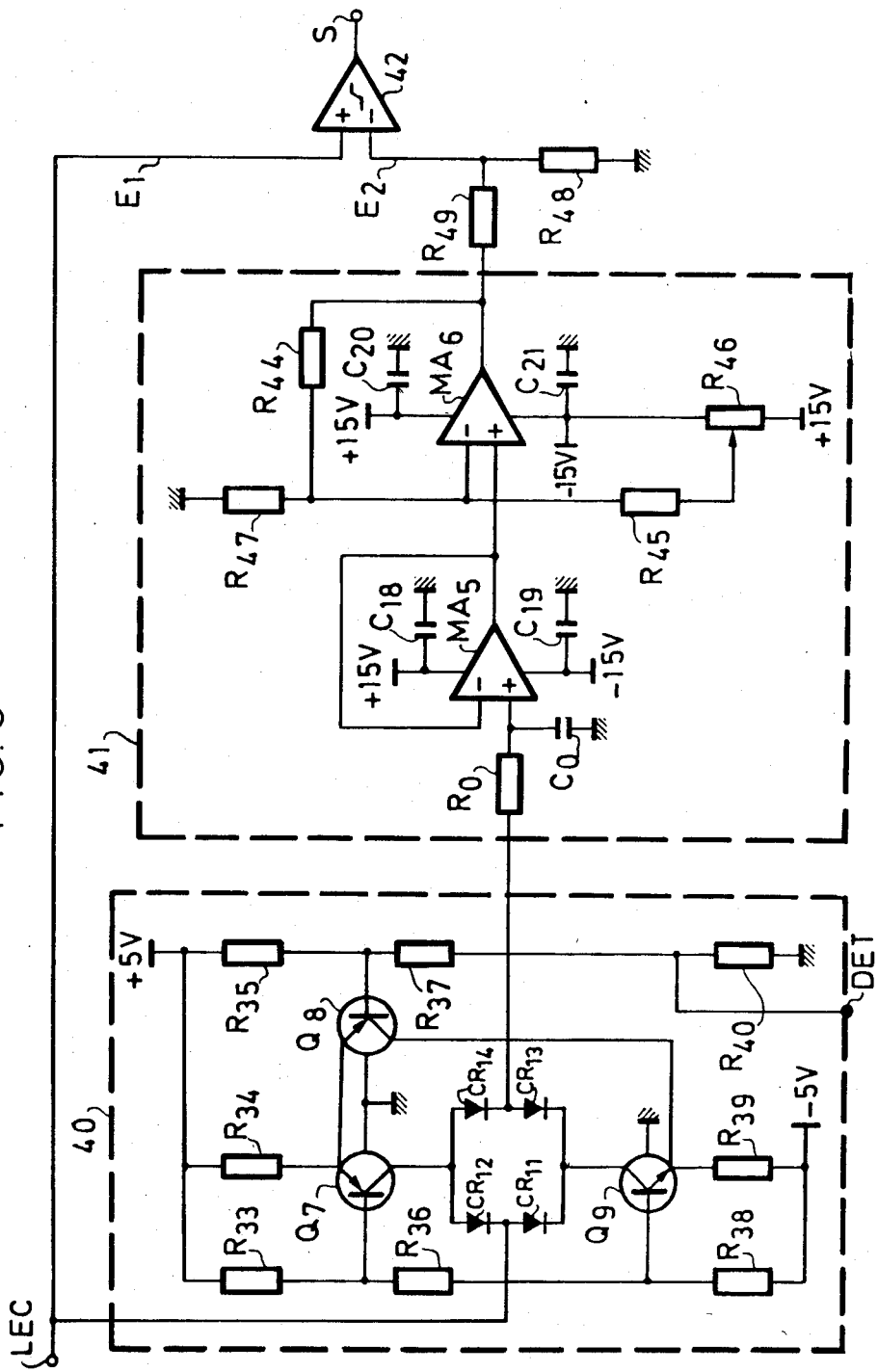
FIG. 6 illustrates a detailed embodiment of the device according to the invention.

By way of further illustration of the invention, an example of an actual embodiment of the shaping device 4 and in particular of the switch 40, of the integrator 41 and of the comparator circuit 42, is illustrated in FIG. 6.

The switch 40 comprises switching circuits incorporating transistors Q7, Q8, Q9 operated by means of a set of biasing resistors R35, R37, R40 receiving the control signal DET. The operation of the appropriately biased transistors Q7, Q8, Q9 controls the conduction of the bridge of diodes CR11, CR12, CR13, CR14. A read signal received at the input LEC is transmitted to the integrator 41.

The integrator block 41 essentially comprises a resistor RO and a capacitor CO having one terminal earthed. To obtain an appropriate integration of the read signal, the values of the resistor RO and of the capacitor CO are selected in such a manner as to have a time constant of the PC circuit appropriate for the duration of the binary elements forming the read signal. By way of example, for a binary element duration of the read signal of 200 ns, a capacitor CO of 1 nF and a resistor RO of 10 Kohm are selected. The integrator 41 further comprises two amplifiers MA5 and MA6 and their biasing circuits, which have the task of amplifying the signal supplied by the resistor RO-capacitor CO combination for feeding a voltage divider $R_{49}$, $R_{48}$ from which is supplied the voltage $E_2$.

Finally, the comparator circuit comprises an operational amplifier 42 with an inverted input voltage divider R48-R49. The amplifier 42 operates in the saturated state.

We claim:
1. A device for restoring a switching waveform from a readout signal representative of digital data recorded on an optical disk, said disk comprising along a track data sections alternating with prerecorded sections of specific configuration, said device comprising:
   rectangular waveform generator means having a first input receiving said readout signal, a second input receiving an adjustable voltage value, and an output for supplying said switching waveform;
   sampling means having an output for selectively transmitting portions of said readout signal having within a predetermined sampling duration a specific configuration found in an alternate sequence of binary elements belonging to said prerecorded sections; and
   means for generating said adjustable voltage value in response to said portions of said readout signal; said adjustable voltage value being held constant between two successive transmissions by said sampling means of said portions of said readout signal.
2. A device as claimed in claim 1, wherein said alternate sequence comprises binary elements at a first logic level and at a second logic level; the sum of the durations at the first logic level and the sum of the durations at the second logic level having within said sampling duration a predetermined ratio; said adjustable voltage value causing the reshaped readout signal representative of said portions to have summed durations for said logic levels in a ratio corresponding to said predetermined ratio.
3. A device as claimed in claim 2, wherein said predetermined ratio is unity.
4. A device as claimed in claim 1, wherein said means for generating said adjustable voltage value in response to said portions of said readout signal are integrator means having an input connected to the output of said sampling means and an output connected to said second input of said rectangular waveform generator means.
5. A device as claimed in claim 4, wherein said rectangular waveform generator means comprise a differential amplifier.
6. A device as claimed in claim 1, further comprising: clock means having a control input, and connected to said control input synchronization means for causing the synchronizing waveform supplied from said clock means to be phase locked in relation with the portions of the reshaped signal representative of the scanning of said prerecorded sections.
7. A device as claimed in claim 6, wherein said synchronization means comprise:
   coincidence gating means having first and second inputs for respectively receiving from said clock means said synchronizing waveform and another synchronizing waveform of higher frequency;
   counting means connected to an output of said coincidence gating means for counting pulses at said higher frequency;
   phase lock means receiving a count from said counting means for supplying to the control input of said clock means a tuning signal; and
   retardation means for applying said readout signal reshaped with a time delay difference between third and fourth inputs of said coincidence gating means.
8. A device as claimed in claim 1, wherein said pattern is a four bit alternate sequence distinguishable from the digital data recordable in said data sections.
9. A device as claimed in claim 1, further comprising means identifying said pattern for controlling said sampling means.

* * * * *